United States Patent [19]

Winhan

[11] 4,411,708
[45] Oct. 25, 1983

[54] METHOD OF MAKING PRECISION DOPED POLYSILICON VERTICAL BALLAST RESISTORS BY MULTIPLE IMPLANTATIONS

[75] Inventor: Lucien C. Winhan, Torrance, Calif.

[73] Assignee: TRW Inc., Redondo Beach, Calif.

[21] Appl. No.: 180,914

[22] Filed: Aug. 25, 1980

[51] Int. Cl.³ .................. H01L 21/263; H01L 21/26; H01L 7/00
[52] U.S. Cl. ..................................... 148/1.5; 148/187; 357/59; 357/91
[58] Field of Search .................. 148/1.5, 187; 357/36, 357/59, 91

[56] References Cited

U.S. PATENT DOCUMENTS

| | | | |
|---|---|---|---|
| 4,063,967 | 12/1977 | Graul et al. | 148/1.5 |
| 4,125,426 | 11/1978 | Inayoshi et al. | 29/578 |
| 4,161,740 | 7/1979 | Frey | 357/36 |
| 4,188,707 | 2/1980 | Asano et al. | 29/571 |
| 4,234,357 | 11/1980 | Scheppele | 148/1.5 |
| 4,266,236 | 5/1981 | Ueda | 357/36 |
| 4,313,255 | 2/1982 | Shinozaki et al. | 29/576 B |

OTHER PUBLICATIONS

Sakurai et al., Jap. Jour. Appl. Phys. 19 (1980) Supplement 19-1, p. 181.
Lee, C. H. IBM-TDB, 22, (1980) 4881-4882.
Barson, F. IBM-TDB, 22 (1980) 4052-4053.

*Primary Examiner*—Upendra Roy
*Attorney, Agent, or Firm*—Lawrence S. Cohen; William K. Konrad

[57] ABSTRACT

The structure and associated fabrication processes disclosed provide a resistive element directly over a specific semiconductor region. Use of such a structure in a high current device ballasts emitter fingers to improve the maximum current flow of the device. The resistor element includes polysilicon which has conductivity affecting impurities in it with concentration less than $10^{20}$ atom/cm³, and typically $10^{17}$ to $10^{19}$ atom/cm³, to create a resistivity of generally 0.05 to 5 ohm-cm.

Such a resistive element may be formed by plural implants into the polysilicon, with subsequent annealing; by smoothly varying, typically between 10 keV and 300 keV, the implant energy during implanting; by implanting an appropriate impurity into doped polysilicon to adjust the effective impurity concentration; or by back-diffusing an impurity from a heavily doped region into the overlaying polysilicon.

11 Claims, 8 Drawing Figures

METHOD OF MAKING PRECISION DOPED POLYSILICON VERTICAL BALLAST RESISTORS BY MULTIPLE IMPLANTATIONS

BACKGROUND OF THE INVENTION

1. Field of the Invention

The invention relates to resistor structures for high current semiconductor devices and processes for forming them, and particularly to the forming of precisely doped polysilicon over an emitter region to form a vertical ballast resistor.

2. Description of Prior Art

Ballast resistors are commonly used in high current semiconductor devices to assist in the distribution of current flow among a set of emitter fingers. The use of such ballast resistors assists in insuring that each emitter finger carries an appropriate share of the total current flow. By balancing the current flow, the maximum current flowing through the entire device may be increased.

Typically, as will be described in more detail below, such ballast resistors are configured to ballast the current load only among the emitter fingers. There is no ballasting of the current flow across the length of each emitter finger, and as a result different portions of each emitter finger are subjected to different current flows. As a result of this "one dimensional" ballasting, prior art high current semiconductor devices have an undesirable thermal profile caused by the varying amounts of current flow through portions of each emitter finger. The resulting hot spots in such a prior art device limit the total current flow possible through it due to the possible thermal runaway of the device at the hot spots, and corresponding destruction of the device.

Accordingly, it is the object of the herein disclosed invention to provide a structure and associated fabrication processes for a high current semiconductor device in which the current flow through portions of each emitter finger is ballasted to reduce the likelihood of thermal runaway. An additional object of the invention is to provide for a high current semiconductor device having improved maximum current flow than that otherwise obtainable. Another object of the invention is to provide a process for precision forming of a polysilicon based resistor over a site in a semiconductor device. Another object of the invention is to provide for a two dimensional ballasting of an emitter structure comprising plural emitter fingers in which ballasting is provided across the length of each emitter finger and among the emitter fingers.

SUMMARY OF THE INVENTION

These and other objects are obtained in the herein disclosed invention by the forming of a polysilicon resistor above an emitter site, the resistor ballasting the current flow through the emitter, thereby reducing the non-uniformity of current flow through portions of each emitter finger. Such a "vertical ballast" resistor above each emitter finger of a high current semiconductor device, when used in conjunction with conventional ballast techniques among plural emitter fingers of a high current semiconductor device, result in the formation of a semiconductor device having a more uniform temperature profile in operation due to the greater uniformity of current flow, and a resulting higher maximum permissible current load on such a device.

Several processes are disclosed for the forming of such a precision polysilicon vertical ballast resistor. Multiple implants of conductivity affecting impurities, each made at a discrete energy level, into polysilicon deposited over the emitter fingers may form a series of gaussian distributions of the impurities in the polysilicon. Subsequent annealing of the device will create a vertical ballast resistor having a generally uniform impurity concentration in the range $10^{17}$ to $10^{19}$ atoms/cm$^3$. Such an effective impurity concentration will provide a vertical ballast resistor having a resistivity in the range 0.05 ohm-cm. of 5 ohm-cm.

Another method disclosed is to continuously vary the ion implant energy during ion implanting of a conductivity affecting impurity into the polysilicon, to obtain, for instance, a generally uniform impurity concentration in the polysilicon. Methods are also disclosed to ion implant appropriate impurities into doped polysilicon to appropriately increase or decrease the impurity concentration profile thereby achieving the desired resistivity for the vertical ballast resistor. Further, a process is disclosed for backdiffusing an impurity from a heavily doped emitter site into the overlying polysilicon layer, thereby providing an appropriate impurity concentration in the polysilicon to ensure suitably adjusted resistivity.

DESCRIPTION OF PREFERRED EMBODIMENTS

Figure 1:
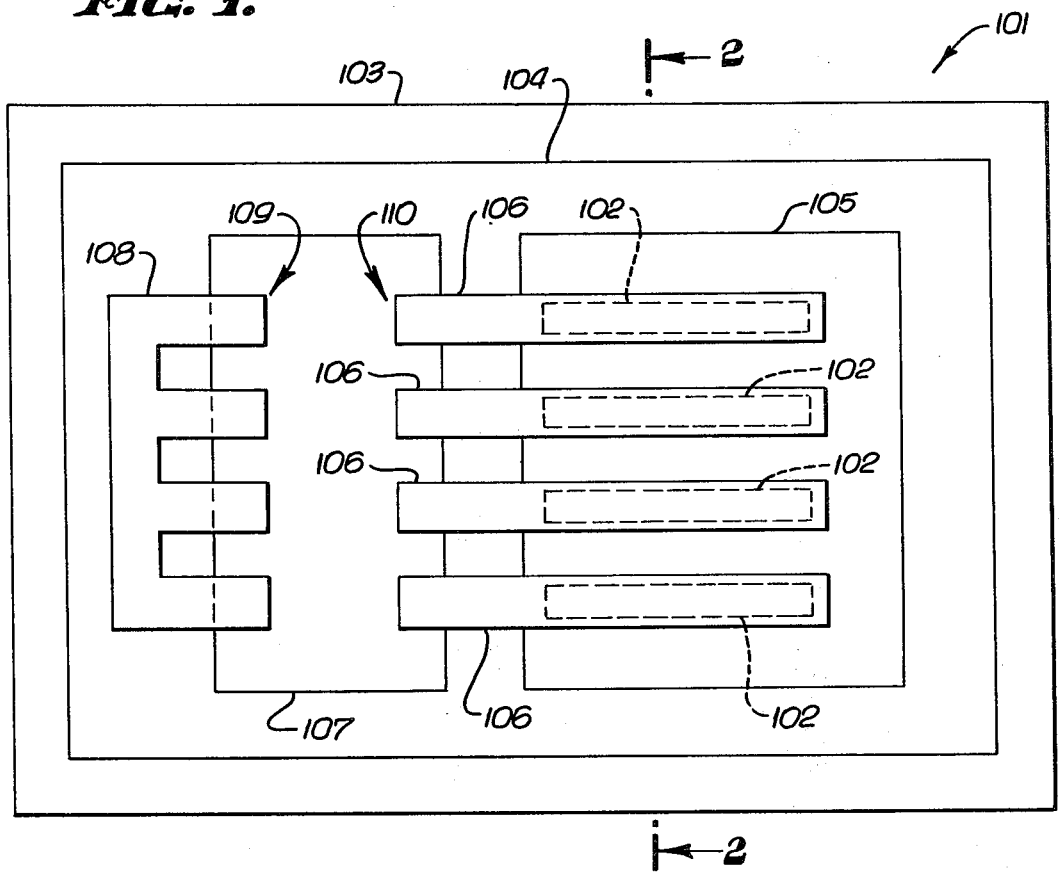
FIG. 1 is a top view of a portion of a semiconductive substrate having a base region, collector region, and plural emitter fingers which are ballasted with respect to each other.

As previously discussed, the use of ballast resistors between emitter fingers in a high current semiconductor device are well known in the art as improving its maximum current capability by balancing the current flow between the individual emitter fingers. FIG. 1 is a top view of a diagrammatic representation of a portion of a semiconductive device 101 having plural ballasted emitter fingers 102.

The semiconductor device 101 includes a semiconductive substrate 103, typically single crystalline silicon. On a portion of the substrate 103 a collector region 104 is formed by conventional means, such as by diffusion. Although only a single collector region 104 is shown on the substrate 103, in a typical device, there may be numerous collector regions formed on a single substrate 103. Within the collector region 104 a base region 105 is formed by conventional techniques, such as by diffusing into the collector region 104 an impurity which forms a region of conductivity opposite that of the collector region 104.

As mentioned, the emitter region 102 illustrated in FIG. 1 comprises plural, emitter fingers of arbitrary shape, not necessarily parallel. Overlying each emitter finger 102 is an associated metallization layer, each of which extends to a resistance area 107. Each metallization finger 106 is in electrical contact with its associated emitter finger 102. A second metallization 108, on the opposite side of the resistance area 107 is used to form an electrical connection through the resistance area 107 to each of the emitter fingers 106. For instance, between the end 110 of a metallization layer 106 overlying an emitter finger 102 and the nearest portion 109 of the second metalization layer 108 is effectively formed a ballast resistor by the resistance area 107 between these metallizations. In such a manner, each emitter finger is resistively connected to other portions of the semiconductive device by appropriate electrical contact with the second metallization portion 108.

Figure 2A:
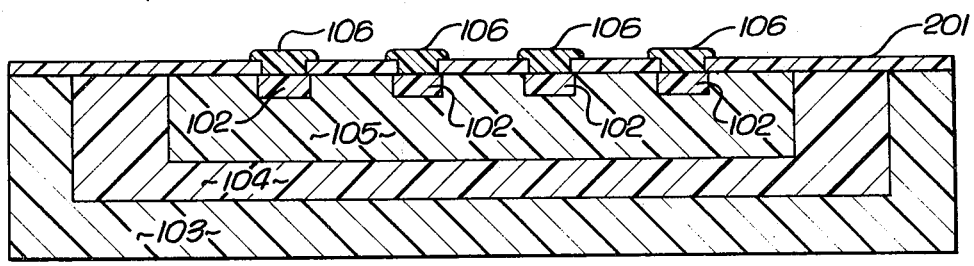
FIG. 2a is a side sectional view through a a prior art device according to FIG. 1, illustrating the lack of a vertical ballast resistor.

FIG. 1 illustrates the manner in which plural emitter fingers may be ballasted to equalize the current flow among the emitter fingers 102. FIG. 2a is a cross section through a prior art device having a top view as in FIG. 1. Although not illustrated in FIG. 1, the cross-section of FIG. 2a illustrates the use of nonconductive layers 201, such as that formed by silicon oxides such as $SiO_2$ to appropriately insulate the various regions and to prevent undesirable electrical couplings from being made. As illustrated in FIG. 2a, prior art ballasting techniques provide for the metallization 106 overlying each emitter finger 102 to directly contact it without appreciable electrical resistance. As previously mentioned, such one dimensional ballasting among emitter fingers does not ballast the current flow through portions of a single emitter finger 102.

Figure 2B:
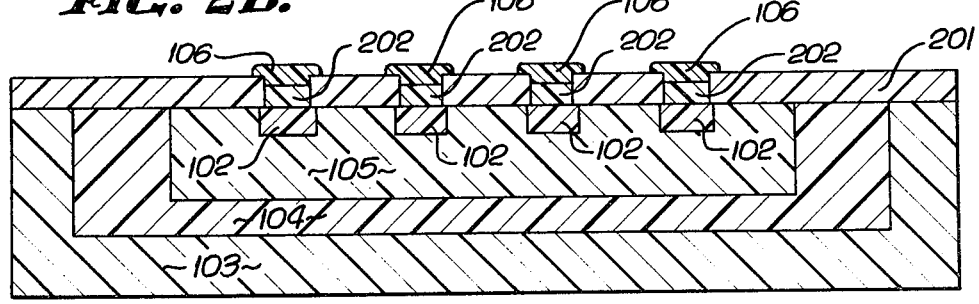
FIG. 2b is a side sectional view similar to FIG. 2a of an embodiment of the invention, showing vertical ballast resistors above the emitter fingers.

FIG. 2b is a sectional view through a device according to FIG. 1, illustrating the inventive vertical ballast resistor 202. The vertical ballast resistor 202 is formed above an associated emitter finger 102. The associated metallization 106 contacts the top surface of the vertical ballast resistor 202, thereby forming a resistive connection with the overlying emitter finger 102. The vertical ballast resistor 202 is formed by depositing polysilicon directly over the corresponding emitter fingers 102. The polysilicon may be undoped when deposited or may be lightly doped, i.e. to a concentration of $10^{20}$ atom/$cm^3$ or less. The depositing of such polysilicon is conventional, and uses appropriate masks to limit the polysilicon to the area over the emitter sites 102.

In order to insure that the polysilicon 202 overlying the emitter fingers 102 provide suitable resistance between the metallization 106 and emitter finger 102, the polysilicon 202 must be precisely doped by a conductivity affecting impurity, such as arsenic, phosphorus, or boron. In conventional semiconductor fabrication processes, undoped polysilicon is used as an insulator and heavily doped polysilicon, i.e. polysilicon having a dopant concentration on the order of $10^{20}$ atoms/$cm^3$ or more, is used as a conductor or possibly as a semiconductor. However, the inventive formation of vertical ballast resistors is based on the fact that polysilicon, if doped in the range of approximately $10^{17}$ to $10^{19}$ atoms/$cm^3$ with a conductivity affecting impurity, has a resistivity between $10^6$ ohm-cm to $10^{-2}$ ohm-cm. Such a resistivity of polysilicon is within the range necessary to form the desired vertical ballast resistors. The effect that an impurity concentration in polysilicon of the indicated range has upon its resistivity has been reported, for instance, in "The Electrical Properties Of Polycrystalline Silicon Films", by John Y. W. Seto, *Journal of Applied Physics*, Volume 46, No. 12, December 1975, which is hereby incorporated by reference. As mentioned in that article, impurity concentrations within an order of magnitude of $10^{18}$ atoms/$cm^3$ substantially affect the resulting resistivity of the polysilicon. The inventive processes described below allow precision control of impurity concentrations in the polysilicon, thereby allowing the formation of polysilicon vertical ballast resistors of a desired resistivity.

Figure 3:
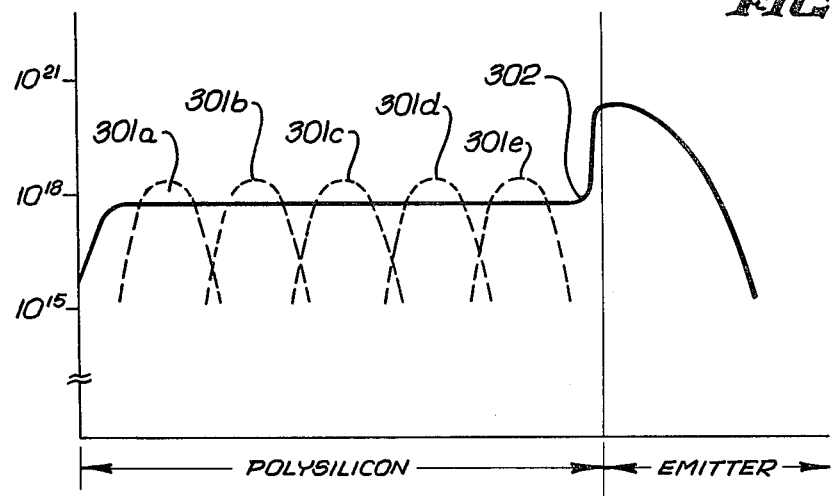
FIG. 3 is a graph of impurity concentration profile, i.e. impurity concentration versus distance from the top surface of the vertical ballast resistor, illustrating the effect that multiple ion implanting of conductivity affecting impurities will have upon the effective impurity concentration of the vertical ballast resistor.

FIG. 3 illustrates the effect upon the concentration of conductivity affecting impurities in polysilicon overlaying an emitter finger that ion implanting at plural discreet energy levels with subsequent annealing will have. The vertical scale indicates the effective dopant concentration in atoms/$cm^3$. As mentioned, the area of most interest in the invention is a range of concentrations centering on approximately $10^{18}$ atoms/$cm^3$. The horizontal scale of FIG. 3 specifies the depth into the polysilicon or emitter region from the top of the polysilicon layer. The horizontal scale of FIG. 3 is not meant to convey the actual depth or ratio of depths between actual emitter regions and polysilicon layers of devices made in accordance with the teachings of the invention.

As indicated in FIG. 3, the impurity concentration in the emitter region is typically on the order of $10^{21}$ atoms/$cm^3$ or higher. As is well known, a conductivity affecting impurity such as arsenic, phosphorus, or boron, may be ion implanted into silicon, whether polycrystalline or monocrystalline. Such ion implant techniques are well known in the industry for use in forming semiconductive regions in a monocrystalline material. Occasionally, such ion implant techniques are used with polysilicon to create a conductive or semiconductive material. However, unlike the present invention, such ion implant techniques are used to heavily dope, for example to a concentration on the order of at least $10^{20}$ atoms/$cm^3$, the polysilicon to obtain the desired properties. Polysilicon doped to such a concentration has well known properties. However, such highly doped polysilicon cannot be used to obtain the desired vertical ballast resistors.

As is well known, the depth of penetration of an impurity being ion implanted in polysilicon is determined by the implant energy chosen, whereas the concentration of impurity which is implanted is determined by the dosage of dopant used during the implant process. Each such implant generally creates a gaussian impurity concentration distribution in the polysilicon.

One process for creating a precision vertical ballast resistor is to perform multiple ion implants of an appropriate impurity or impurities into undoped polysilicon to create, as indicated in FIG. 3, a series 301a, ... 301e of implants, each having a gaussian distribution. By subsequent annealing of the semiconductive device, a more or less uniform impurity concentration 302 in the desired range may be formed, thereby creating the desired vertical ballast resistor. It is not necessary that each of the implants be of the same impurity. Several impurities may be used in combination to provide, after annealing, an effective impurity concentration in the polysilicon which results in the desired resistivity.

Figure 4:
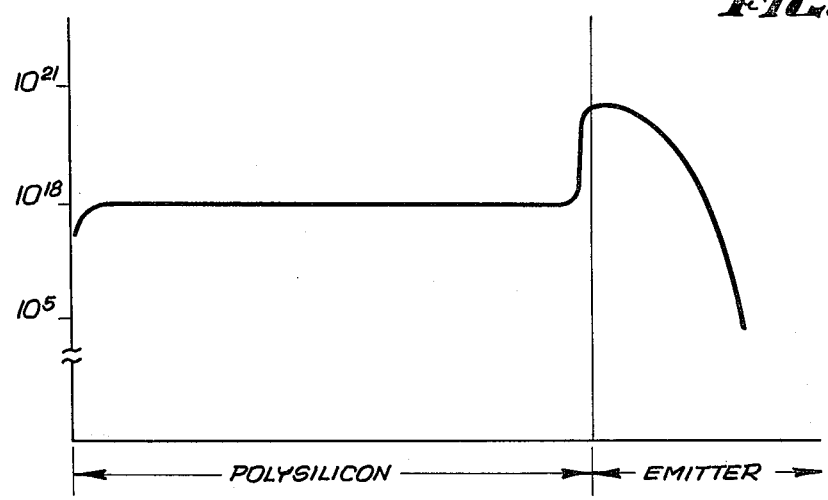
FIG. 4 is a graph similar to that of FIG. 3 illustrating the effect upon impurity concentration that continuously varying the implant energy used during the ion implant process will have.

FIG. 4 is a graph similar to that of FIG. 3, illustrating the effect that continuously varying the ion implant energy will have in forming a non-gaussian distribution of implanted impurity in the undoped polysilicon. Although FIG. 4 illustrates a generally uniform implant concentration profile, by appropriate varying of the implant energy, which determines the depth of implant, and dosage, which determins the concentration of the implant, other non-gaussian distributions may be obtained. Typically, the implant energy will be continuously varied in the range between 300 keV and 10 keV to implant dopant in a layer of polysilicon on the order of 3,000 Angstrom thick.

Figure 5:
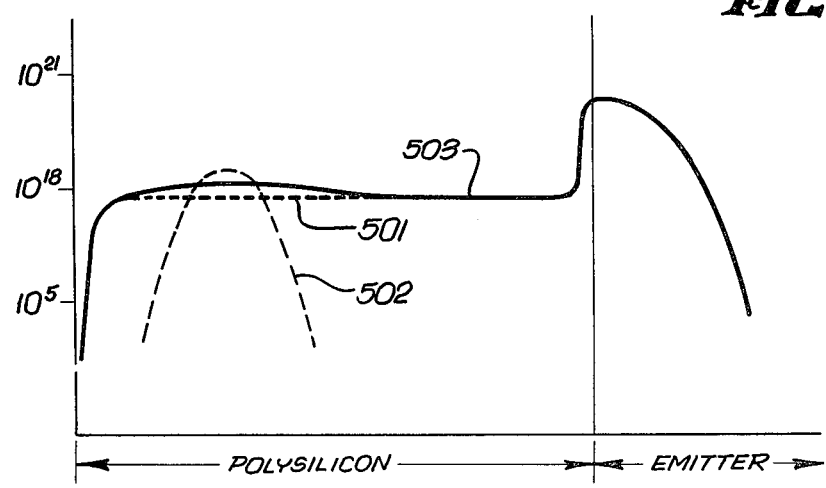
FIG. 5 is a graph similar to FIG. 3 illustrating the effect that ion implanting into a doped polysilicon vertical ballast resistor will have upon the effective impurity concentration of the vertical ballast resistor.

Although the processes discussed in connection with FIGS. 3 and 4 use undoped polysilicon and subsequent ion implanting of impurities to create the desired resistivity, FIG. 5 illustrates the effect that ion implanting into lightly doped polysilicon will have upon the impurity concentration profile. By precision ion implanting of additional impurities 502 into polysilicon having an impurity concentration 501 slightly below that desirable, the resistance may be adjusted in the desired direction as indicated in line 503.

Figure 6:
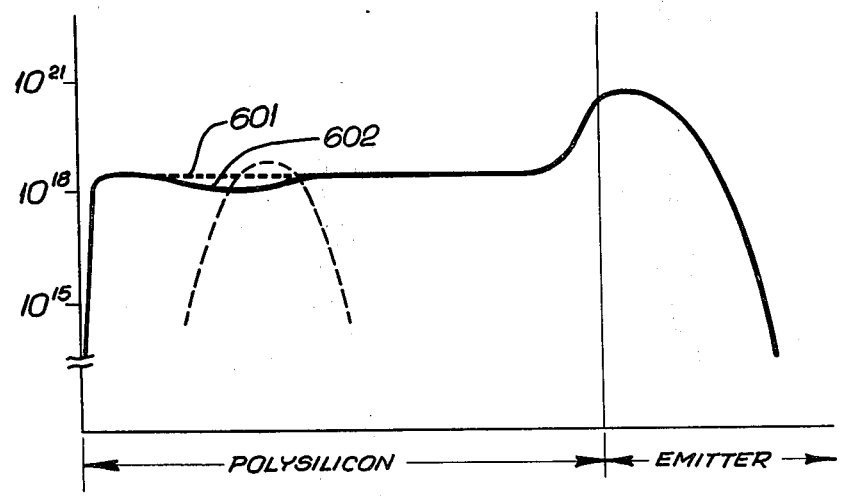
FIG. 6 is a graph similar to FIG. 3 in which the effect of implanting of certain impurities into doped polysilicon forming the vertical ballast resistor will have by eliminating impurity carrier sites within the polysilicon lattice to lower the effective carrier concentration.

FIG. 6 is a graph similar to FIG. 3 illustrating the effect that ion implanting of a material such as silicon or neon into doped polysilicon having a concentration indicated by line 601 will have in "damaging" the polysilicon lattices or moving the impurities to interstitial locations, increasing the resistivity by lowering the effective impurity concentration, as indicated by line 602, With such a technique, the deposited polysilicon is initially doped at a slightly higher concentration 601 than that desired. By ion implanting appropriate elements into the polysilicon, its effective concentration will be lowered.

(Effective impurity concentration is used to indicate the apparent impurity concentration, as determined by measurement of the resulting resistivity or conductivity of polysilicon. Due to the polycrystalline nature of polysilicon, the effective concentration may be different from the actual concentration.)

Figure 7:
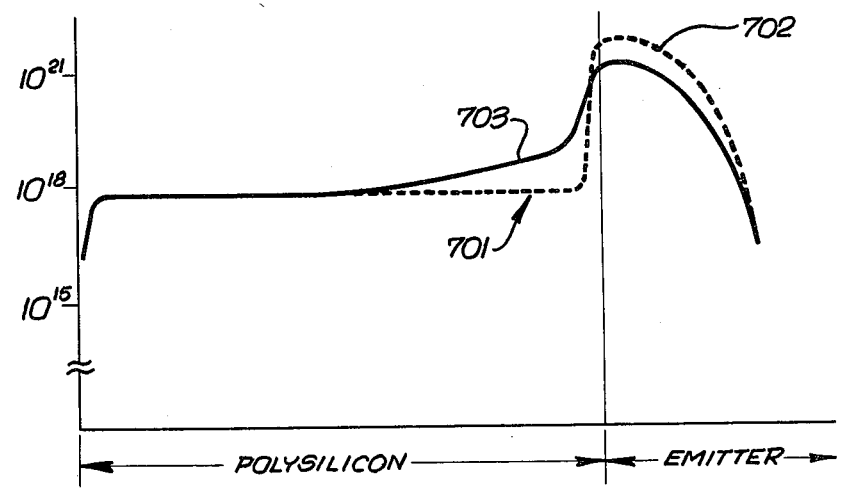
FIG. 7 is a graph similar to FIG. 3 illustrating the effect of backdiffusing an impurity from an underlying heavily doped emitter region into an overlying doped polysilicon vertical ballast resistor will have upon the effective impurity concentration of the ballast resistor.

FIG. 7 is a graph similar to FIG. 3 illustrating the effect of heat treating a wafer having a high concentration 702 of conductivity affecting impurity in its emitter region, causes the impurity to backdiffuse into an overlying undoped or lightly doped polysilicon layer. As indicated in FIG. 7, polysilicon having an initial impurity concentration 701 insufficient to provide the desired resistivity for the vertical ballast resistor is first deposited. Prior to depositing of the polysilicon, the emitter will be heavily doped as indicated by line 702. After subsequent heat treating, the impurity concentrations of the polysilicon and emitter will be adjusted as indicated by line 703 so as to redistribute the emitter dopant, and cause a portion of it to backdiffuse into the overlying polysilicon, thereby adjusting the vertical ballast resistor resistance. This process uses the difference in impurity diffusion ratio between polysilicon and monocrystalline silicon to obtain a suitable impurity concentration in both the polysilicon resistors and emitter fingers.

It is expected that any of the above-described techniques for controlling the impurity concentration in polysilicon will provide a vertical ballast resistor having the desired resistivity, namely in the range 0.05 ohm-cm to 5 ohm-cm. While only a limited number of embodiments of the invention have been discussed, it will be readily apparent to persons skilled in the art that changes and modification may be made without departing from the spirit of the invention. For instance, although the invention has been described for use with high current semiconductor devices having plural emitter fingers, it is equally applicable to the forming of a resistor directly above any portion of a semiconductor substrate, whether or not the resistor will be used to ballast current flow. Accordingly, the foregoing disclosure, description and Figures are for illustrative purposes only, and do not in any way limit the invention, which is defined only by the claims.

I claim:

1. A process for forming a vertical polysilicon resistor directly over and in electrical contact with a portion of the surface of a semiconductor device, comprising the steps of:

providing an electrically nonconductive mask to define the surface portion;

depositing a layer of polysilicon over the surface portion;

ion implanting into the polysilicon at plural discrete energy levels at least one conductivity affecting impurity;

annealing the semiconductor device to form a more uniform effective dopant concentration in the polysilicon in the range $10^{17}$ to $10^{19}$ atoms/cm$^3$; and forming an electrical connection to the top of the polysilicon, thereby forming a resistor directly over and in electrical contact with the surface portion.

2. A process according to claim 1 wherein the step of depositing forms a polysilicon layer generally 100 to 10,000 Angstroms thick.

3. A process according to claim 1 wherein the step of implanting uses plural conductivity affecting impurities.

4. A process according to claim 1 wherein the polysilicon being deposited includes conductivity affecting impurities.

5. A process according to claim 4 wherein the step of implanting impurities into the deposited polysilicon uses an impurity of opposite conductivity type than that in the deposited polysilicon, thereby lowering the effective carrier concentration.

6. A process for forming a vertical polysilicon resistor directly over and in electrical contact with a portion of the surface of a semiconductor device, comprising the steps of:

providing an electrically nonconductive mask to define the surface portion;

depositing a layer of polysilicon over the surface portion;

ion implanting in the polysilicon a conductivity affecting impurity, the implant energy smoothly varying during the implanting to obtain a nongaussian dopant distribution in the polysilicon, with an average impurity concentration between $10^{17}$ and $10^{19}$ atoms/cm$^3$; and forming an electrical connection to the top of the polysilicon, thereby forming a resistor directly over and in electrical contact with the surface portion.

7. A process according to claim 6 wherein the implant energy varies in the range 10 keV to 300 keV.

8. A process according to claim 7 wherein the implant energy is varied to implant the impurity generally uniformly throughout the polysilicon.

9. A process for forming a vertical polysilicon resistor over and in electrical contact with a portion of the surface of a semiconductor device having a high concentration of conductivity affecting impurity comprising:

providing an electrically nonconductive mask to define the surface portion;

depositing a layer of polysilicon over the surface portion;

heating the semiconductor device to diffuse the impurities from the surface portion back into the overlying polysilicon to form an effective dopant concentration in the polysilicon in the range $10^{17}$ to $10^{19}$ atoms/cm$^3$; and forming an electrical connection to the top of the polysilicon layer.

10. A process according to claim 9 wherein after the heating step is performed the step of ion implanting into the polysilicon conductivity affecting impurities to adjust the resistivity of the polysilicon.

11. A process for forming a vertical polysilicon resistor directly over and in electrical contact with a portion of the surface of a semiconductor device and having a high precision resistivity between 0.05 ohm-cm and 5 ohm-cm, comprising the steps of:

providing an electrically non-conductive mask to define the surface portion;

depositing a layer of polysilicon over the surface portion;

disposing in the polysilicon a conductivity affecting impurity to achieve a first level resistivity;

ion implanting in the polysilicon a conductivity affecting material to adjust the first resistivity level as necessary to achieve the particular desired resistivity in the range of 0.05 ohm-cm to 5 ohm-cm.

* * * * *